United States Patent [19]
Lin et al.

[11] Patent Number: 5,882,970
[45] Date of Patent: Mar. 16, 1999

[54] METHOD FOR FABRICATING FLASH MEMORY CELL HAVING A DECREASED OVERLAPPED REGION BETWEEN ITS SOURCE AND GATE

[75] Inventors: Chih-Hung Lin, I-Lan; Hwi-Huang Chen, Taipei; Gary Hong, B.S.I.P. Hsinchu; Chen-Chiu Hsue, Hsinchu, all of Taiwan

[73] Assignee: United Microelectronics Corporation, Taiwan

[21] Appl. No.: 552,428

[22] Filed: Nov. 3, 1995

[51] Int. Cl.[6] .................................................. H01L 21/8247
[52] U.S. Cl. ............................................ 438/264; 438/529
[58] Field of Search .................................. 437/30, 43, 44

[56] References Cited

U.S. PATENT DOCUMENTS

| | | | |
|---|---|---|---|
| 4,852,062 | 7/1989 | Baker et al. | 437/43 |
| 5,215,936 | 6/1993 | Kinugawa | 437/44 |
| 5,264,384 | 11/1993 | Kaya et al. | 437/44 |

*Primary Examiner*—Chandra Chaudhari
*Attorney, Agent, or Firm*—Townsend and Townsend and Crew LLP

[57] ABSTRACT

A flash memory cell is fabricated by forming a lightly-doped region with only an implantation procedure to avoid lateral diffusion resulting from an increased overlap between the source region and gate as well as a short channel effect, while surrounding the source region with the lightly-doped region to thereby increase the breakdown voltage between the source region and the substrate.

11 Claims, 4 Drawing Sheets

METHOD FOR FABRICATING FLASH MEMORY CELL HAVING A DECREASED OVERLAPPED REGION BETWEEN ITS SOURCE AND GATE

BACKGROUND OF THE INVENTION

1. Field of the Invention

The present invention generally relates to integrated circuit fabrication. In particular, the present invention relates to a method for fabricating a memory cell with a decreased overlap between the source region and gate of the memory cell to thereby decrease the capacitance thereof and render it immune to undesirable short channel effects.

2. Description of Related Art

The flash memory device is one kind of the EEPROM (Electrically Erasable Programmable Read-Only Memory) device which is erased by means of electric signals. FIGS. 1A–1D show a conventional method for fabricating a flash memory cell suited for application on a semiconductor substrate 1, either a P-type silicon wafer or a P-well formed in an N-type silicon wafer.

As shown in FIG. 1A, a tunnel oxide layer 10, a floating gate 11, an inter-gate dielectric layer 12, and a control gate 13 are sequentially formed on the semiconductor substrate 1. The tunnel oxide layer 10 may be a silicon oxide layer, for example, formed by thermal oxidation on the surface of the semiconductor substrate 1. The floating gate 11 and control gate 13 are made of polysilicon deposited by a LPCVD (Low-Pressure Chemical Vapor Deposition) process. The polysilicon is doped with impurities to increase the conductivity thereof. The inter-gate dielectric layer 12 comprises a three-layer oxide-nitride-oxide structure.

Photolithography and etching processes are then applied. The control gate 13, inter-gate dielectric layer 12, floating gate 11, and tunnel oxide 10 are subsequently patterned and etched to form a stacked gate 14 as depicted in FIG. 1B. In the drawing, the tunnel oxide 10 is shown overlying the substrate's surface to prevent the substrate 1 from implantation damage. Afterwards, a photoresist layer 100 is formed to cover the substrate 1 on one side of the stacked gate 14. By utilizing the photoresist layer 100 as a mask, impurities 15 are implanted into the substrate 1 to form a lightly-doped region 16. The impurities 15, such as arsenic ions, are implanted with a dosage of about $1E14 cm^{-2}$ to $1E15 cm^{-2}$ and at an energy of about 40KeV to 60KeV. Accordingly, the junction depth of the lightly-doped region 16 ranges from about $0.15\mu m$ to $0.3\mu m$. The photoresist layer 100 is thereafter removed.

A drive-in process, such as that performed at a temperature of about 1000° C. for about 60 minutes, is utilized to diffuse the implanted impurities within the lightly-doped region 16 to a predetermined depth, for example, between $0.5\mu m$ and $0.6\mu m$. As depicted in FIG. 1C, the lightly-doped region 16 is driven to the deeper junction depth designated by reference numeral 17. Because the thermal drive-in process is isotropic, it is inevitable that lateral diffusion occurs. Therefore, an overlap between the lightly-doped region 17 and the stacked gate 14 is formed.

As is shown in FIG. 1D, impurities 18, such as arsenic ions, are implanted into the substrate 1, by using stacked gate 14 as masking, to form a pair of heavily-doped regions 19A and 19B, serving as a drain region and a source region of the memory cell, respectively. Note that the source region 19B is disposed within the lightly-doped region 17 enclosed thereby.

An electrical potential of about 7 volts is applied to the drain region 19A when programming the flash memory cell. This generates high energy hot electrons near the drain junction, while a gate voltage of about 10–13V applied to control gate 13 provides a vertical electric field to draw the hot electrons through the tunnel oxide layer 10 and inject them into the floating gate 11. The injected hot electrons will therefore increase the threshold voltage of the flash memory cell.

The Fowler-Nordheim effect is used if erasing the flash cell is needed. At such time, a voltage is applied to source 19B to drain off the electrons stored within floating gate 11 via tunnel oxide layer 10. However, this applied voltage is apt to cause a junction breakdown between the heavily-doped region 19B and substrate 1. Therefore, the lightly-doped region 17 is formed to envelope the source region 19B and increase the breakdown voltage between the lightly-doped region 17 and substrate 1.

However, this conventional method forms the lightly-doped region 17 by thermally driving the implanted impurities to the desired junction depth. Lateral diffusion, as mentioned above, not only increases the overlapping area between the lightly-doped region 17 and stacked gate 14 and the parasitic capacitance therebetween, it also reduces the effective channel length between the source region 19B and the drain region 19A which leads to the undesirable short channel effect. Thus, there is a need for a flash memory cell fabrication process which reduces the overlap between a source region and the stacked gate.

SUMMARY OF THE INVENTION

The method of the present invention for fabricating satisfies this need by decreasing the overlap between the source region and the stacked gate of flash memory cells.

The method comprises the following steps:

providing a semiconductor substrate of a first conductivity type;

forming a stacked gate having sidewalls on the substrate;

forming a lightly-doped region of a second conductivity type in the substrate on one side of the stacked gate with an implantation procedure;

forming a drain region of the second conductivity type in the substrate on another side of the stacked gate;

forming spacers on the sidewalls; and forming a source region of the second conductivity type within the lightly-doped region.

BRIEF DESCRIPTION OF THE DRAWINGS

These and other features, aspects, and advantages of the present invention will become better understood with regard to the following description and accompanying drawings where.

DESCRIPTION OF THE PREFERRED EMBODIMENT

Referring to FIGS. 2A–2D, the method of the present invention is suited for fabricating a memory cell on a semiconductor substrate 2, such as a P-type silicon wafer or a P-well region formed within a silicon wafer.

Figure 1A:
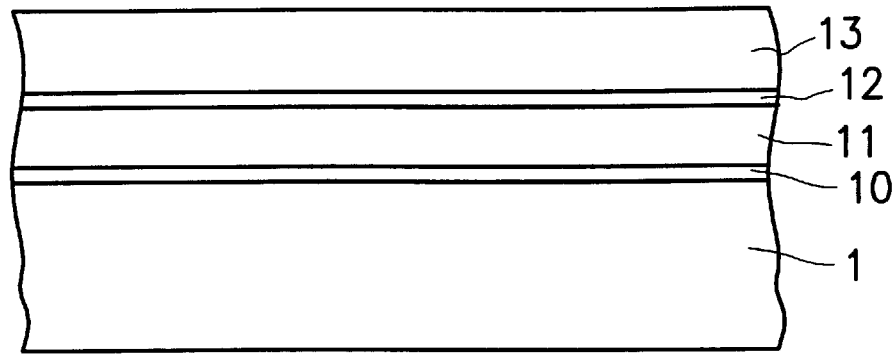
FIGS. 1A–1D depict the conventional method for fabricating a flash memory cell in cross-sectional views.
Figure 1B:
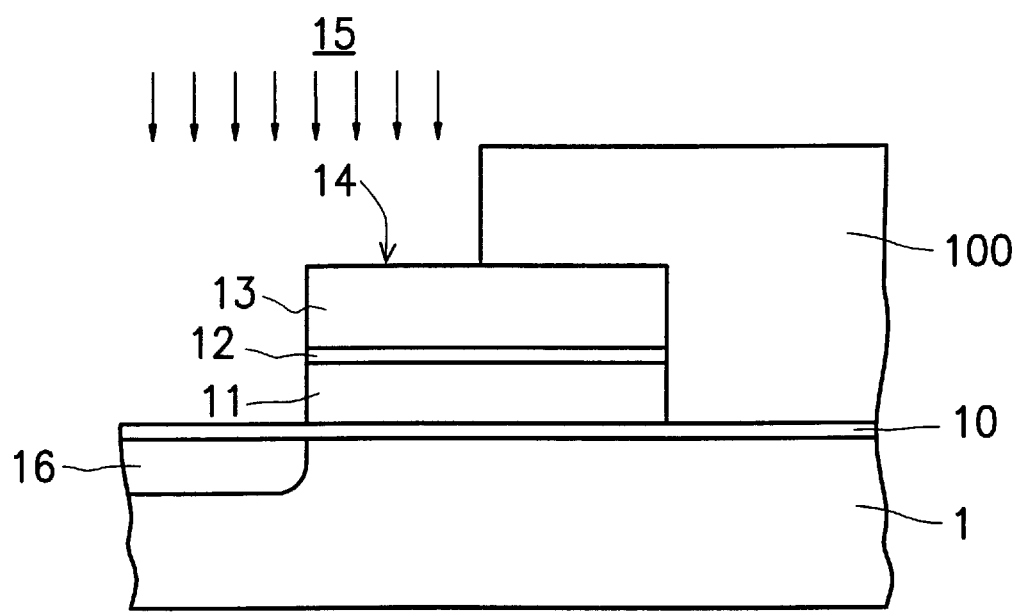
Figure 1C:
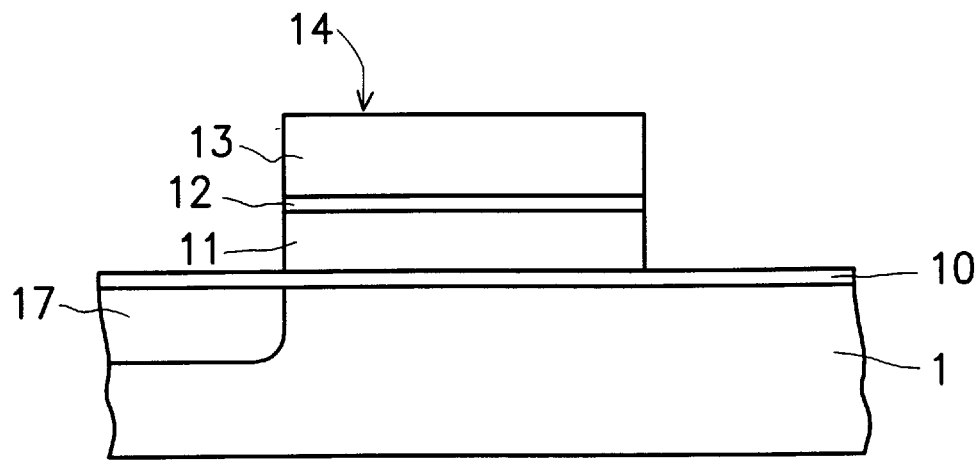
Figure 1D:
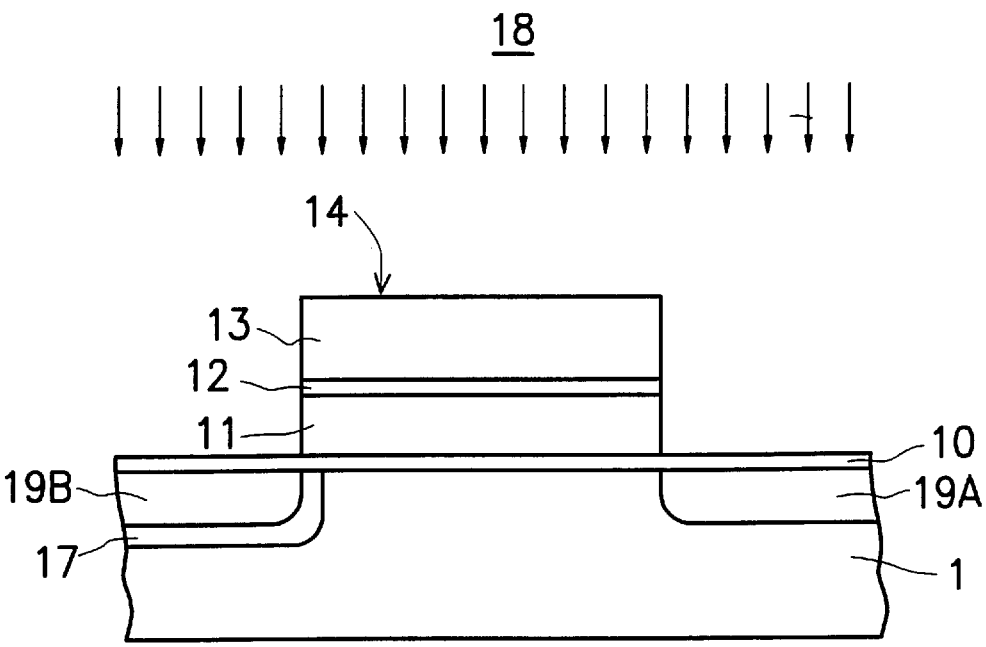
Figure 2A:
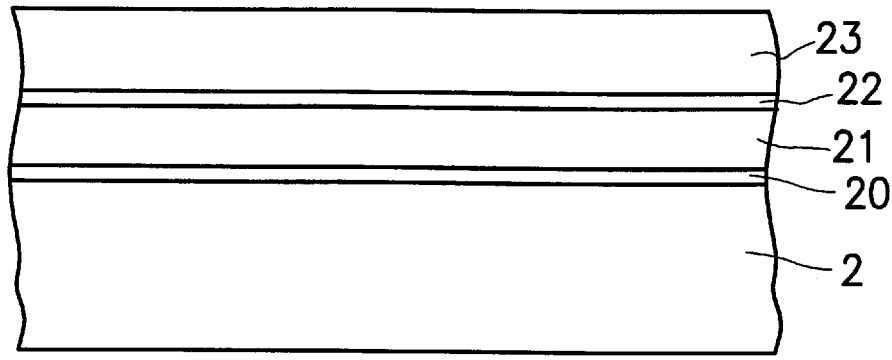
FIGS. 2A–2D are cross-sectional views of a flash memory cell during progressive stages of its manufacture in accordance with the present invention.

As shown in FIG. 2A, a tunnel oxide layer 20, a floating gate 21, an inter-gate dielectric layer 22, and a control gate 23 are sequentially formed on semiconductor substrate 2. Tunnel oxide layer 20 may, for example, be a silicon oxide layer formed by thermal oxidation of the surface of semiconductor substrate 2. The floating gate 21 and control gate 23 are both made of polysilicon deposited by a LPCVD (Low-Pressure Chemical Vapor Deposition) process, which may optionally be doped with impurities to increase its conductivity. The inter-gate dielectric layer 22 is a three-layer oxide-nitride-oxide structure.

Figure 2B:
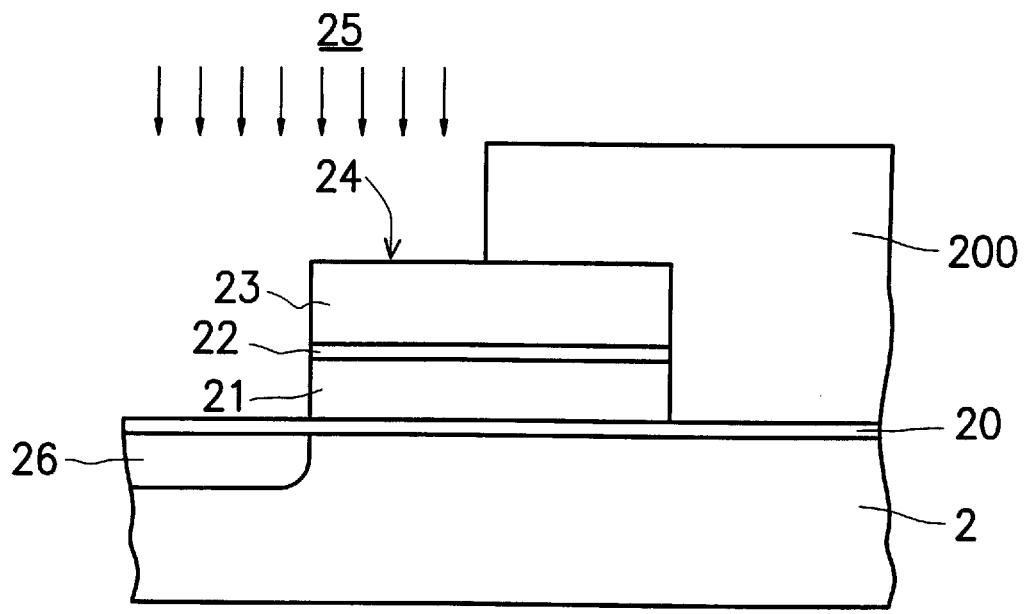

Photolithography and etching process are then applied. Control gate 23, inter-gate dielectric layer 22, floating gate 21, and tunnel oxide 20 are subsequently patterned and etched to form a stacked gate 24 as depicted in FIG. 2B. As shown in the drawing, the tunnel oxide layer 20 overlying the substrate surface remains in place to prevent the substrate 2 from later implantation damage. Next, a photoresist layer 200 is formed to cover the substrate 1 on drain side of the stacked gate 24. Utilizing photoresist layer 200 as a mask, impurities 25 are implanted into the substrate 2 to form a lightly-doped region 26. The impurities 25, such as phosphorus ions, are implanted with a dosage of about $1E14 cm^{-2}$ to $1E15 cm^{-2}$ and at an energy of about 50KeV to 100KeV so that the junction depth of the lightly-doped region 16 can envelope a source region 29B formed thereafter. After that, the photoresist layer 200 is removed.

Figure 2C:
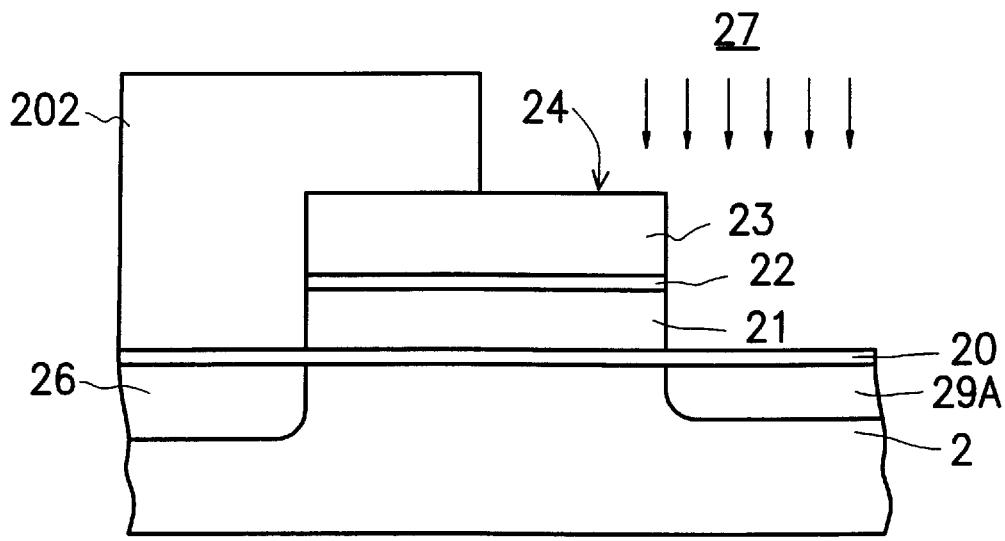

Moreover, as shown in FIG. 2C, a further photoresist layer 202 is formed with a photolithography process so that it covers the lightly-doped region 26. Using the photoresist layer 202 as a mask, impurities 27 are implanted into the substrate 2 to form a drain region 29A on one side of the stacked gate 24 opposite the lightly-doped region 26. The photoresist layer 202 is thereafter removed to expose sidewalls 204 of stacked gate 24.

Figure 2D:
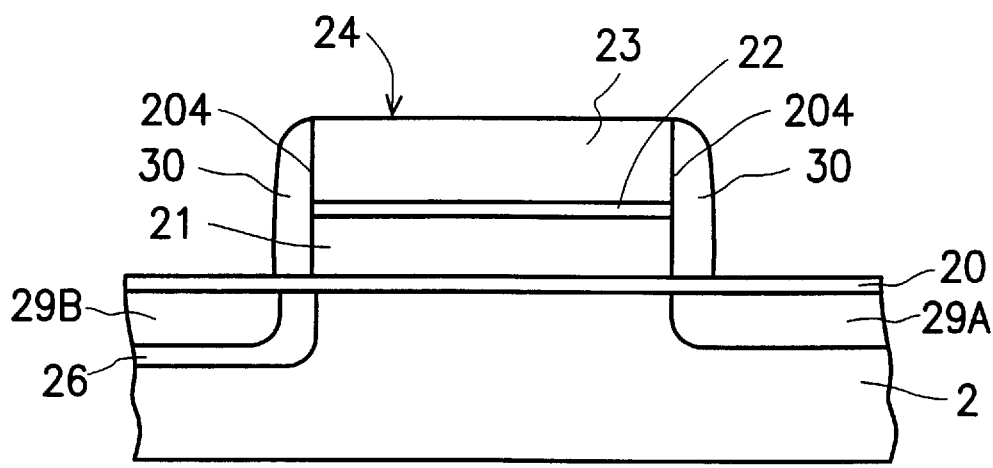

Next, spacers 30 are formed on the sidewalls 204 of the stacked gate by depositing a silicon oxide layer or silicon nitride layer over the surface of the substrate and etching it back to thereby form the spacers 30. As shown in FIG. 2D, the spacers 30 together with stacked gate 24 serve as a shielding mask during the implantation of impurities 28 into substrate 2 to form a source region 29B within the lightly-doped region 26. Simultaneously, the impurities are also implanted into the drain region 29A where they merely increase the doping concentration thereof.

Thus, with the present invention a flash memory cell can be fabricated which has a lightly-doped region without requiring a thermal drive-in process. Lateral diffusion from an increased overlap between the source region and gate, as well as the short channel effect, are avoided. Furthermore, the source region is still surrounded by the lightly-doped region, which increases the breakdown voltage between the source region and the substrate.

What is claimed is:

1. A method for fabricating a flash memory cell, comprising the steps of:

providing a semiconductor substrate of a first conductivity type;

forming a stacked gate, having a first side and a second side, on said substrate;

covering the first side of the stacked rate and a portion of said substrate adjacent said first side with a first implantation mask;

forming a lightly-doped region of a second conductivity type in said substrate along said second side of said stacked gate with a first implantation procedure;

removing said first implantation mask;

covering said lightly-doped region and said second side of the stacked gate with a second implantation mask;

forming a drain region of a second conductivity type in said substrate adjacent said first side of said stacked gate with a second implantation procedure;

removing said second implantation mask;

forming spacers on said first and second sides of the stacked gate; and forming a source region of a second conductivity type within said lightly-doped region with a third implantation procedure.

2. The method as claimed in claim 1, wherein the step of forming said stacked gate comprises forming, in sequence, a tunnel oxide layer, a floating gate, an inter-gate dielectric layer, and a control gate on the substrate.

3. The method as claimed in claim 2, wherein forming said inter-gate dielectric layer comprises forming an oxide-nitride-oxide layer structure.

4. The method as claimed in claim 2, wherein forming said floating gate and control gate comprises making each of polysilicon.

5. The method as claimed in claim 1, wherein forming said spacers comprises making said spacers of one of etched-back silicon oxide and silicon nitride.

6. The method as claimed in claim 1, wherein providing said semiconductor substrate comprises providing a silicon wafer.

7. The method as claimed in claim 1, wherein providing said semiconductor substrate comprises forming a well region in a silicon wafer.

8. The method as claimed in claim 1, wherein said first conductivity type is P-type and said second conductivity type is N-type.

9. The method as claimed in claim 1, wherein said first implantation procedure comprises implanting phosphorus ions with a dosage of about $1E14 cm^{-2}$ to $1E15 cm^{-2}$ and at an energy of about 50 KeV to 100 KeV.

10. The method as claimed in claim 1, wherein providing said first implantation mask and said second implantation mask comprises providing a photoresist layer.

11. The method as claimed in claim 1, wherein said lightly-doped region and said stacked gate are minimally overlapped.

* * * * *